(12) United States Patent
Hong

(10) Patent No.: US 7,824,984 B2
(45) Date of Patent: Nov. 2, 2010

(54) METHOD OF FABRICATING A TRENCH DMOS (DOUBLE DIFFUSED MOS) TRANSISTOR

(75) Inventor: Jeong Pyo Hong, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/244,009

(22) Filed: Oct. 2, 2008

(65) Prior Publication Data

US 2009/0159989 A1 Jun. 25, 2009

(30) Foreign Application Priority Data

Dec. 24, 2007 (KR) ...................... 10-2007-0136237

(51) Int. Cl.
*H01L 21/336* (2006.01)
(52) U.S. Cl. ...................... 438/270; 438/589; 257/396; 257/397
(58) Field of Classification Search .................. 257/330, 257/341, 476
See application file for complete search history.

(56) References Cited

U.S. PATENT DOCUMENTS 7,319,256 B1 * 1/2008 Kraft et al. ................... 257/330
2008/0150015 A1 * 6/2008 Cho ........................... 257/330

* cited by examiner

*Primary Examiner*—Thanh V Pham
*Assistant Examiner*—Mark A Laurenzi, III
(74) *Attorney, Agent, or Firm*—Saliwanchik, Lloyd & Saliwanchik

(57) ABSTRACT

Disclosed is a method of fabricating a semiconductor device. The method can include forming a gate material layer on an inner surface of a trench which extends into a part of a semiconductor substrate by passing through an insulating layer formed on the semiconductor substrate, etching the gate material layer to an initial height in the trench above a top surface of the semiconductor substrate, etching the insulating layer such that the thickness of the insulating layer is reduced, forming a gate electrode in the trench by secondarily etching the etched gate material layer, and removing the insulating layer having the reduced thickness.

18 Claims, 4 Drawing Sheets

US 7,824,984 B2

METHOD OF FABRICATING A TRENCH DMOS (DOUBLE DIFFUSED MOS) TRANSISTOR

CROSS-REFERENCE TO RELATED APPLICATION

The present application claims the benefit under 35 U.S.C. §119 of Korean Patent Application No. 10-2007-0136237, filed Dec. 24, 2007, which is hereby incorporated by reference in its entirety.

BACKGROUND

Typically, a DMOS (double diffused MOS) transistor is used as a power transistor for a high voltage power integrated circuit. The DMOS transistor supplies a large amount of current per unit area to a position requiring low forward voltage drop.

The DMOS transistor can be a trench DMOS transistor in which a channel is vertically formed and a gate is formed in a trench extending between a source and a drain. The trench DMOS transistor provides low on-resistance.

BRIEF SUMMARY

Embodiments of the present invention provide a method of fabricating a semiconductor device, which can reduce damage to a gate insulating layer, and in particular, to a gate insulating layer formed in a trench.

A method of fabricating a semiconductor device according to an embodiment includes forming a gate material layer on an inner surface of a trench which extends into a part of a semiconductor substrate by passing through an insulating layer formed on the semiconductor substrate; performing an initial etching of the gate material layer, etching the insulating layer to reduce the thickness of the insulating layer; forming a gate electrode in the trench by secondarily etching the initially etched gate material layer, and removing the etched insulating layer.

A method of fabricating a semiconductor device according to another embodiment includes forming a gate material layer on an inner surface of a trench and on an insulating layer formed on a semiconductor substrate, the trench extending into a part of the semiconductor substrate by passing through the insulating layer; forming a ground pad on the insulating layer by primarily etching the gate material layer; forming a gate electrode in the trench by secondarily etching the primarily etched gate material layer; and etching the insulating layer.

A trench MOS transistor according to an embodiment can include a drain region including first conductive impurities, a first conductive epitaxial layer on the drain region, a gate insulating layer disposed on an inner surface of a trench formed in the epitaxial layer, a gate electrode on the gate insulating layer in the trench, a body region formed by implanting second conductive impurities into the epitaxial layer, and a source region formed by implanting the first conductive impurities into the body region. A top surface of the gate insulating layer is positioned above a top surface of the gate electrode.

According to the semiconductor device fabricating method of an embodiment, the gate material layer can protect the gate insulating layer formed at the inner side of the trench when performing an initial etching of the insulating layer.

Further, according to the semiconductor device fabricating method of an embodiment, the gate material layer and the insulating layer can be separately etched, so that damage to the gate insulating layer can be reduced.

DETAILED DESCRIPTION

A procedure for fabricating a trench MOSFET according to an embodiment will be described with reference to FIGS. 1 to 7.

Figure 1:
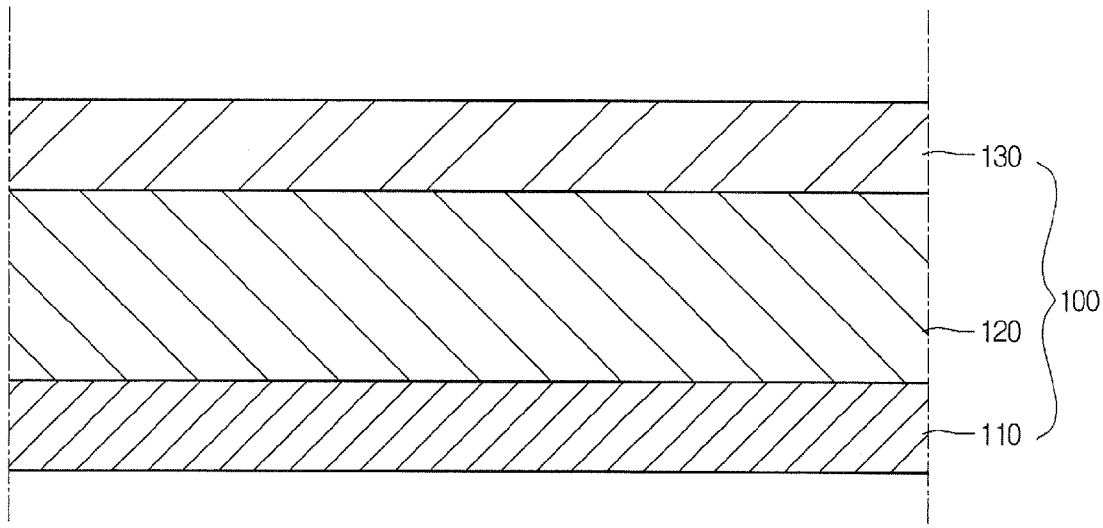
FIGS. 1 to 7 are cross-sectional views illustrating the procedure for fabricating a trench MOSFET according to an embodiment of the present invention.

Referring to FIG. 1, an N type epitaxial layer 120 including lightly doped N type impurities can be formed on an n+ type drain region 110 including heavily doped N type impurities. In detail, the N type epitaxial layer 120 includes a lower concentration of N type impurities as compared with the n+ type drain region 110. According to embodiments, the N type impurities can include P, As and the like.

Thus, the n+ type drain region 110 has a resistance lower than that of the N type epitaxial layer 120.

Then, P type impurities can be implanted into the N type epitaxial layer 120 to form a lightly doped P type body region 130. The P type impurities can include B and the like. In an embodiment, the N type epitaxial layer 120 can have a thickness of about 5 μm to about 6 μm.

As described above, a semiconductor substrate 100 can be provided, which includes the n+ type drain region 110, the N type epitaxial layer 120 and the P type body region 130.

Figure 2:
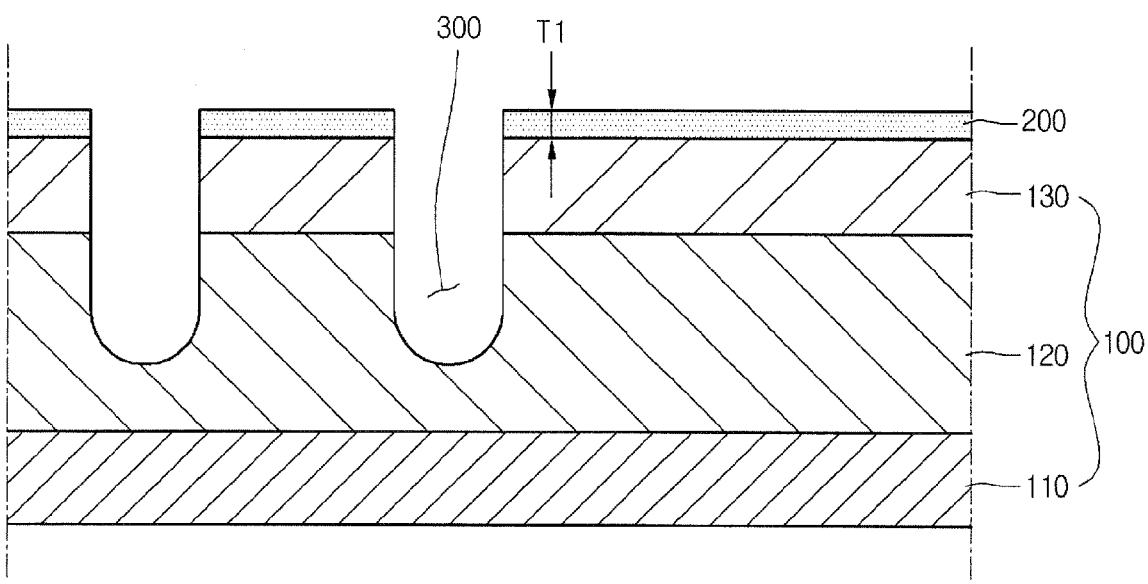

Referring to FIG. 2, an insulating layer 200 can be formed on the semiconductor substrate 100. The insulating layer 200 can be formed through a thermal oxidation process or a CVD (chemical vapor deposition) process. In a specific embodiment, the insulating layer 200 is formed with a thickness T1 of about 2500 Å to about 3500 Å.

At this time, the insulating layer 200 can include, for example, $SiO_x$ (where x is a natural number).

Then, a trench 300, which extends through the insulating layer 200 and a part of the semiconductor substrate 100, can be formed. The trench 300 is formed by passing through the P type body region 130 and a part of the N type epitaxial layer 120.

Figure 3:
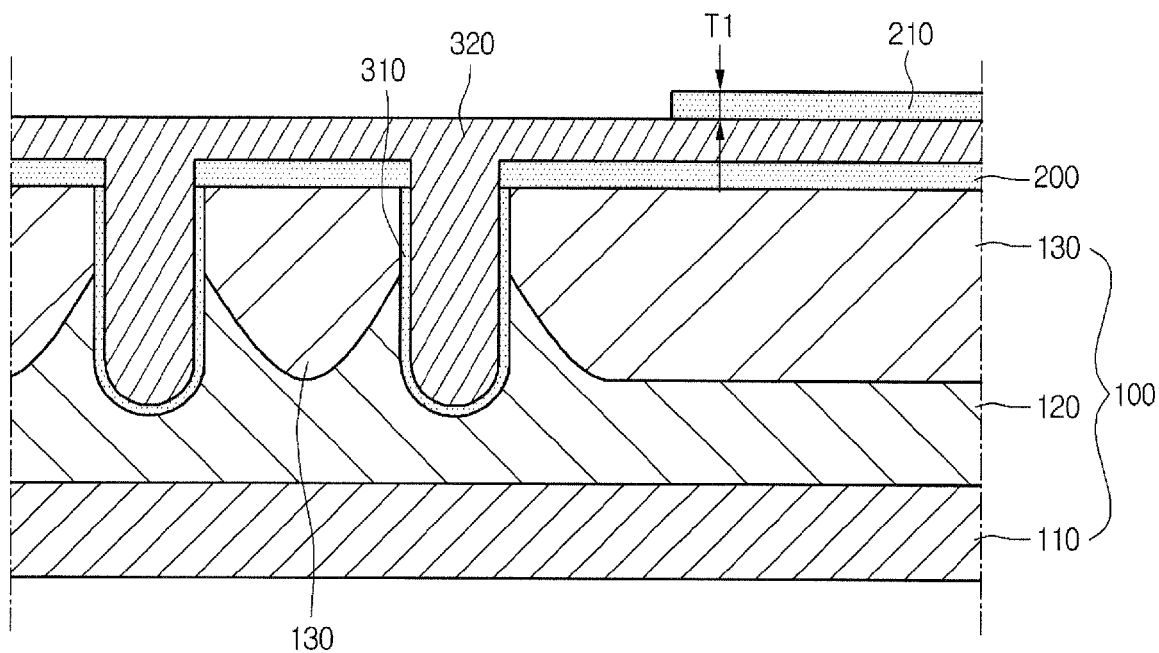

Referring to FIG. 3, the semiconductor substrate 100 having the insulating layer 200 is subject to a thermal oxidation process so that a gate insulating layer 310 is formed on the inner surface of the trench 300.

The thermal oxidation process can include a dry oxidation process or a steam oxidation process that is performed at a temperature of about 900° C. to about 1100° C.

At this time, the P type impurities included in the P type body region 130 are redistributed through the thermal oxidation process, the P type impurities adjacent to the trench 300 are discharged through the trench 300, and the P type impurities far away from the trench 300 are diffused downward.

Thus, the P type body region 130 has a convex-down parabolic shape.

Then, a polysilicon layer 320 can be formed on the insulating layer 200 and the inner surface of the trench 300 (i.e. on the surface of the gate insulating layer 310). The polysilicon layer 320 can be formed through, for example, a CVD process and the like.

Next, a mask pattern 210 can be formed on the polysilicon layer 320. In an embodiment, to form the pattern mask 210, an oxide layer can be formed on the polysilicon layer 320, and then patterned through a mask process.

The mask pattern 210 can have a thickness T1 substantially identical to the thickness T1 of the insulating layer 200.

Figure 4:
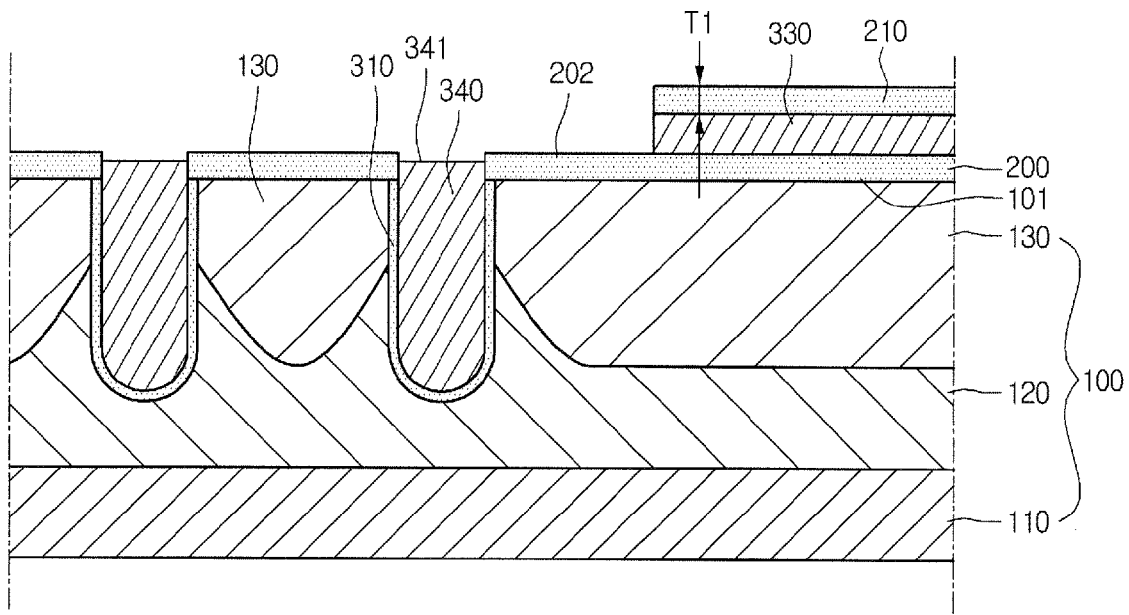

Referring to FIG. 4, after forming the mask pattern 210, the polysilicon layer 320 can undergo an initial etch by using the mask pattern 210 as an etch mask. At this time, the polysilicon layer 320 is etched such that an upper surface 341 of the initially etched polysilicon layer 340 is positioned below an upper surface 202 of the insulating layer 200 and positioned above an upper surface 101 of the semiconductor substrate 100.

Further, the polysilicon layer 320 that is covered by the mask pattern 210 can form a ground pad 330 on the insulating layer 200. The ground pad 330 can have a plate shape to protect a semiconductor device from an electric impact, such as static electricity, applied to the semiconductor device.

According to an embodiment, the polysilicon layer 320 undergoes an initial etch process to expose the upper surface of the insulating layer 200 while remaining in the trench and on the insulating layer 200 below the mask pattern 210.

Figure 5:
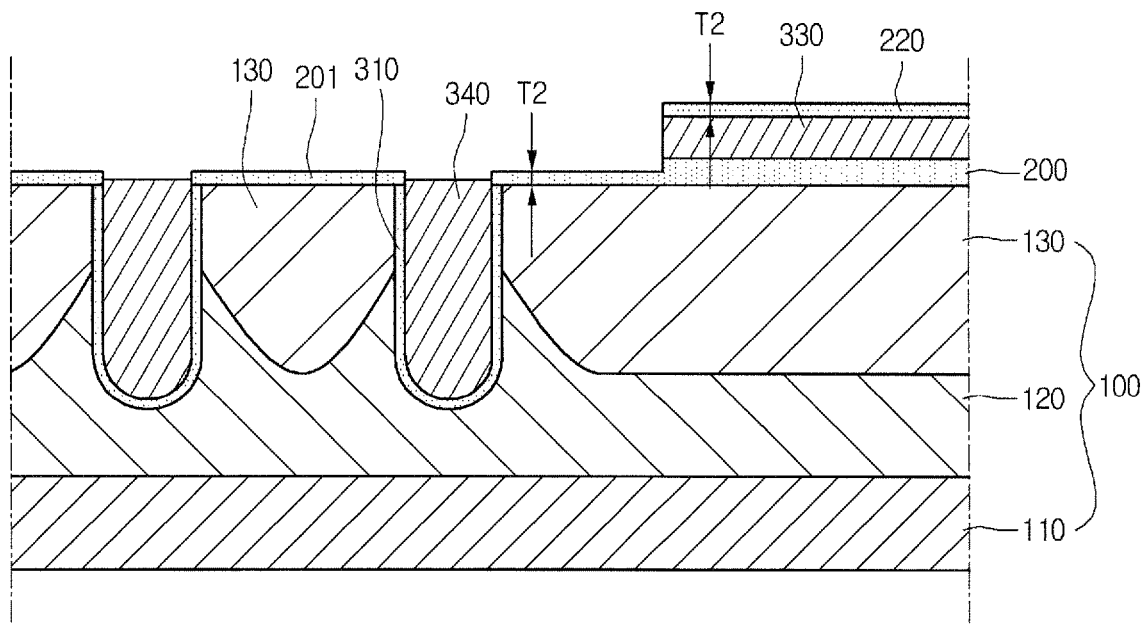

Referring to FIG. 5, after performing the initial etching of the polysilicon layer 320, the insulating layer 200 and the mask pattern 210 can undergo an initial etch.

At this time, the insulating layer 200 and the mask pattern 210 can be etched to have a thickness T2 of about 1000 Å to about 1500 Å.

When the insulating layer 200 and the mask pattern 210 are etched during the initial etch, the gate insulating layer 310 is protected by the polysilicon layer 340 that underwent an initial etch. Thus, damage to the gate insulating layer 310 when the insulating layer 200 and the mask pattern 210 are etched can be reduced.

Figure 6:
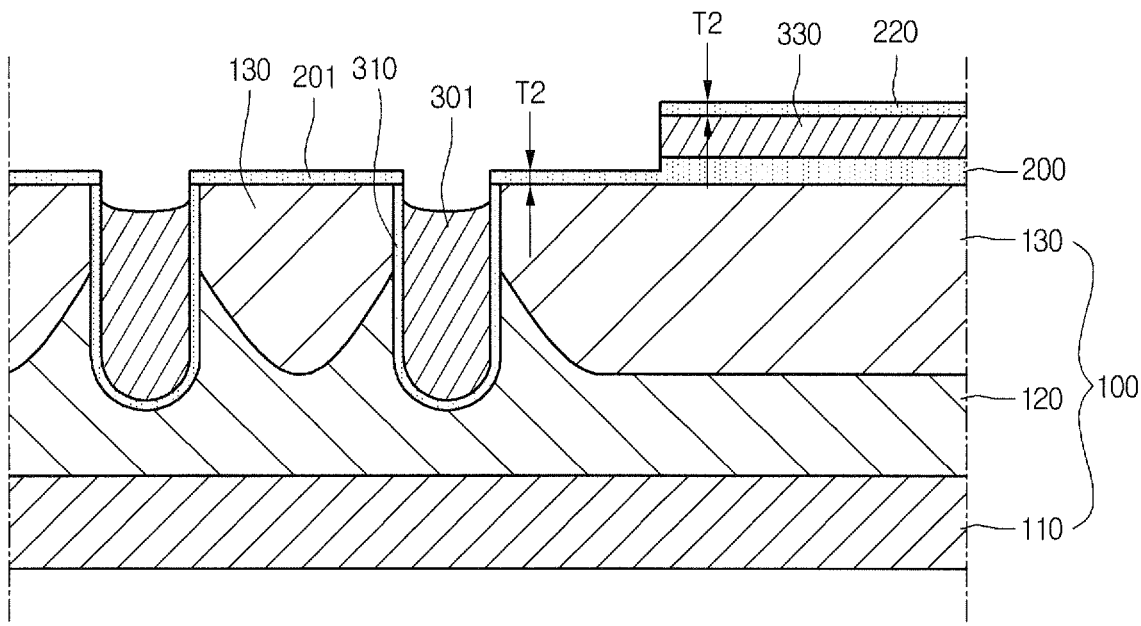

Referring to FIG. 6, the initially etched polysilicon layer 340 can undergo a second etch process using the partially etched insulating layer 201 and the partially etched mask pattern 220 as an etch mask to form a gate electrode 301 recessed in the trench 300.

Figure 7:
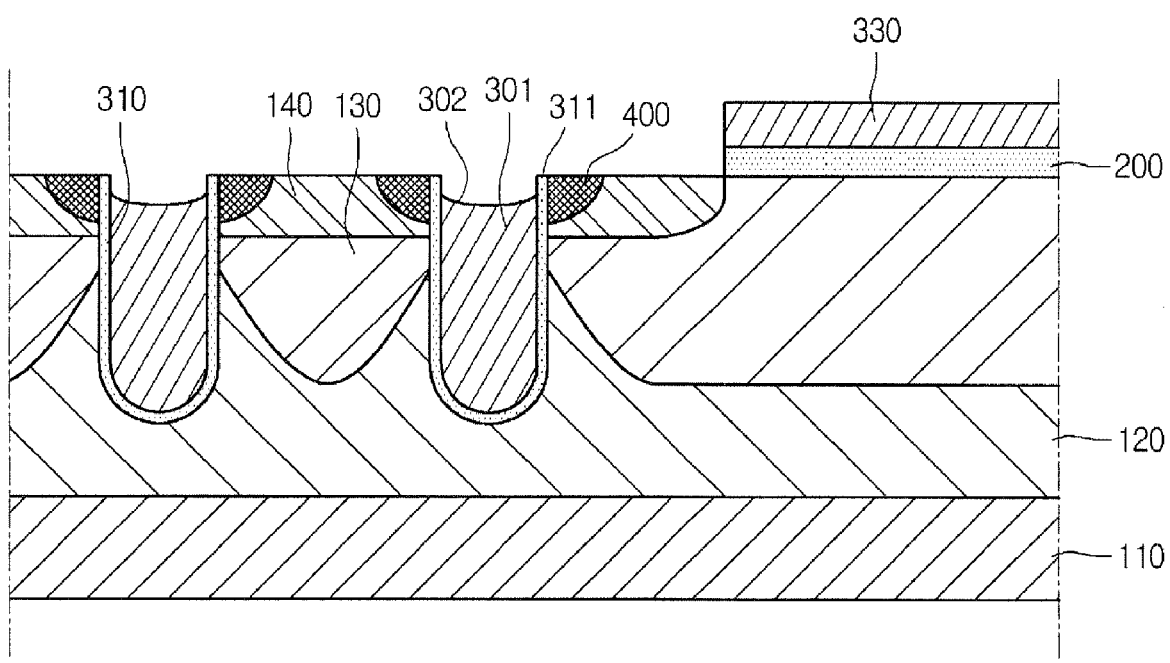

Referring to FIG. 7, P type impurities can be implanted into the semiconductor substrate 100 to form a P type region 140, and heavily doped N type impurities can be selectively implanted into sides of the gate electrode 301 to form n+ type source regions 400.

Although not shown, an interlayer dielectric layer can be formed on the semiconductor substrate 100, and contact electrodes connected with the gate electrode 301 and the source regions 400 can be formed by passing through the interlayer dielectric layer.

Further, a drain electrode can be electrically connected with the n+ type drain region 110, and a vertical channel is formed between the n+ type drain region 110 and the n+ type source regions 400.

Furthermore, because in certain embodiments a ground pad 330 including polysilicon is formed on the semiconductor substrate 100 and includes material identical to that of the gate electrode 301, an electric impact applied to the trench MOSFET can be absorbed by the ground pad 330.

According to embodiments, the gate electrode 301 and the n+ type source regions 400 are insulated from each other by the gate insulating layer 310. In detail, the gate insulating layer 310 inhibits a short-circuit between the gate electrode 301 and the n+ type source regions 400.

When the insulating layer 200 and the mask pattern 210 are etched in the initial etching process for the insulating layer and mask pattern, the gate insulating layer 310 is protected by the initially etched polysilicon layer 340, so that the gate insulating layer 310 is less damaged.

Consequently, the semiconductor device fabricating method according to embodiments can manufacture a semiconductor device capable of inhibiting a short-circuit between the gate electrode 301 and the n+ type source regions 400.

Hereinafter, a trench MOSFET formed according to the embodiment will be additionally described with reference to FIG. 7. By performing an initial and secondary etch of the polysilicon layer of the electrode 301, the upper surface 311 of the gate insulating layer 310 is positioned above the top surface 302 of the gate electrode 301.

Since the top surface of the gate insulating layer 310 is positioned above the gate electrode 301, a short-circuit between the gate electrode 301 and the n+ type source regions 400 can be inhibited from occurring.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device comprising the following sequential steps:
   providing a semiconductor substrate;
   forming an insulating layer on the semiconductor substrate;
   forming a trench through the insulating layer and a portion of the semiconductor substrate;
   forming a gate insulating layer on the inner surface of the trench;
   forming a gate material layer on the insulating layer and in the trench on the gate insulating layer;
   performing an initial etch of the gate material layer;
   performing an initial etch of the insulating layer;
   forming a gate electrode in the trench by performing a second etching process with respect to the initially etched gate material layer; and
   performing a second etch to the initially etched insulating layer.

2. The method according to claim 1, wherein providing the semiconductor substrate comprises:
   providing an N type epitaxial layer on an n+ type drain region; and
   forming a P type body region on the N type epitaxial layer.

3. The method according to claim 2, wherein forming the trench through the insulating layer and the portion of the semiconductor substrate comprises forming the trench through the P type body region and a portion of the N-type epitaxial layer.

4. The method according to claim 1, wherein performing the initial etch of the gate material layer comprises:
forming a mask layer on the gate material layer; and
etching the gate material layer by using the mask layer as an etch mask.

5. The method according to claim 4, wherein, forming the gate electrode comprises performing the second etching process using the mask layer as the etch mask.

6. The method according to claim 4, wherein the mask layer includes material identical to material of the insulating layer.

7. The method according to claim 6, wherein the mask layer is formed to have the same thickness as the insulating layer.

8. The method according to claim 4, wherein during the performing of the initial etch of the insulating layer, the mask layer is initially etched; and wherein during the performing of the second etch to the initially etched insulating layer, the initially etched mask layer is etched.

9. The method according to claim 4, wherein the etch mask provides a pattern for a ground pad, wherein performing the initial etch of the gate material layer forms the ground pad on the insulating layer.

10. The method according to claim 1, wherein performing the initial etch of the gate material layer comprises etching the gate material layer to expose an upper surface of the insulating layer, wherein the top surface of the gate material layer remaining in the trench is above the top surface of the semiconductor substrate.

11. The method according to claim 1, wherein the insulating layer has a thickness of about 1000 Å to about 1500 Å after performing the initial etch of the insulating layer.

12. The method according to claim 1, wherein performing the initial etch of the insulating layer reduces the thickness of the insulating layer, and wherein performing the second etch to the initially etched insulating layer comprises removing the insulating layer having the reduced thickness.

13. The method according to claim 1, further comprising forming a source region at a side of the trench.

14. A method of fabricating a semiconductor device, comprising:
providing a semiconductor substrate;
forming an insulating layer on the semiconductor substrate;
forming a trench through the insulating layer and a portion of the semiconductor substrate;
forming a gate insulating layer on the inner surface of the trench;
forming a gate material layer on the insulating layer and in the trench on the gate insulating layer;
forming a ground pad on the insulating layer by performing an initial etch of the gate material layer;
forming a ground pad on the insulating layer by performing an initial etch of the gate material layer; performing an initial etch of the insulating layer after forming the ground pad; forming a gate electrode in the trench by performing a second etch of the initially etched gate material layer; and performing a second etch to the initially etched insulating layer after forming the gate electrode.

15. The method according to claim 14, wherein after forming the gate electrode, a top surface of the gate insulating layer is disposed above a top surface of the gate electrode.

16. The method according to claim 14, further comprising forming a source region at sides of the trench.

17. The method according to claim 1, wherein an upper surface of the initially etched gate material layer is positioned below an upper surface of the insulating layer and above an upper surface of the semiconductor substrate.

18. The method according to claim 14, wherein an upper surface of the initially etched gate material layer is positioned below an upper surface of the insulating layer and above an upper surface of the semiconductor substrate.

\* \* \* \* \*